United States Patent [19]

Greason et al.

[11] Patent Number: 5,781,557
[45] Date of Patent: Jul. 14, 1998

[54] MEMORY TEST MODE FOR WORDLINE RESISTIVE DEFECTS

[75] Inventors: Jeffrey K. Greason, Portland; Daniel R. Grumbling, Beaverton, both of Oreg.

[73] Assignee: Intel Corporation, Santa Clara, Calif.

[21] Appl. No.: 775,574

[22] Filed: Dec. 31, 1996

[51] Int. Cl.$^6$ ............................................. G11C 29/00
[52] U.S. Cl. ........................................ 371/21.1; 371/21.4
[58] Field of Search ............................ 371/21.1, 21.4, 371/21.2; 365/201, 189.01, 189.07

[56] References Cited

U.S. PATENT DOCUMENTS

| | | | |
|---|---|---|---|
| 4,418,403 | 11/1983 | O'Toole et al. | 365/201 |
| 5,331,594 | 7/1994 | Hotta | 365/201 |
| 5,365,482 | 11/1994 | Nakayama | 365/201 |
| 5,377,152 | 12/1994 | Kushiyama et al. | 365/210 |
| 5,463,636 | 10/1995 | Nakayama | 371/21.1 |
| 5,687,121 | 11/1997 | Lee et al. | 365/185.11 |

*Primary Examiner*—Hoa T. Nguyen
*Attorney, Agent, or Firm*—Blakely, Sokoloff, Taylor & Zafman

[57] ABSTRACT

A method and apparatus for detecting resistive defects in a memory device. A pulldown device is placed at the end of a wordline opposite the end of the wordline having a wordline driver. When the test mode is enabled the wordline pulldown device is turned on. By tailoring the on resistance of the pulldown device such that it is a few times larger than the wordline wire resistance, a resistive divider may be created between the wordline wire resistance and the pulldown device resistance. If a resistive defect exists in the wordline, the increased wordline resistance will create a voltage drop in the wordline when the pulldown device is turned on. This voltage drop indicates that a defect exists in the wordline, and the defect may be located by determining the area of the wordline in which the voltage drop occurs.

18 Claims, 8 Drawing Sheets

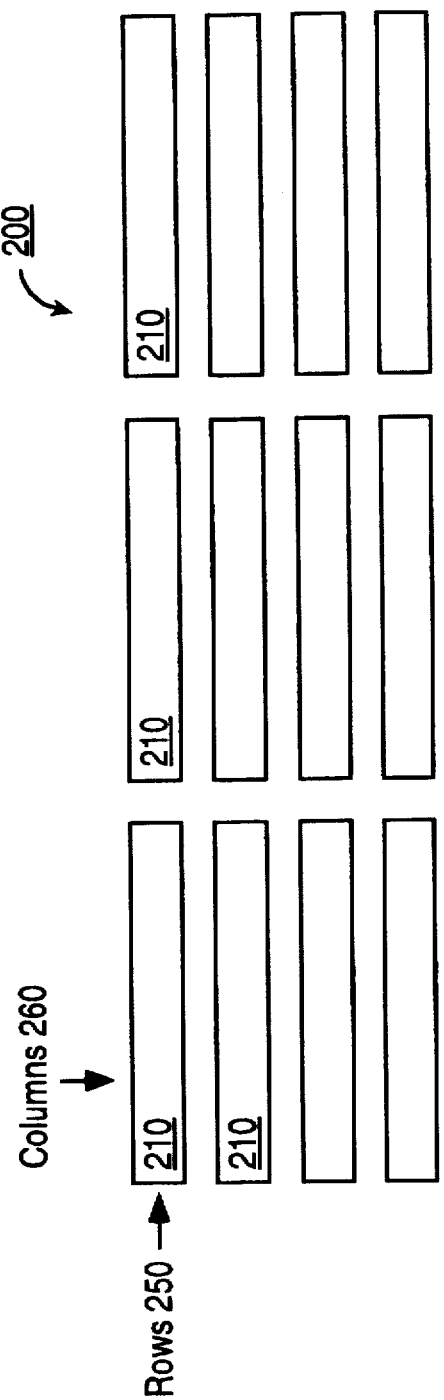

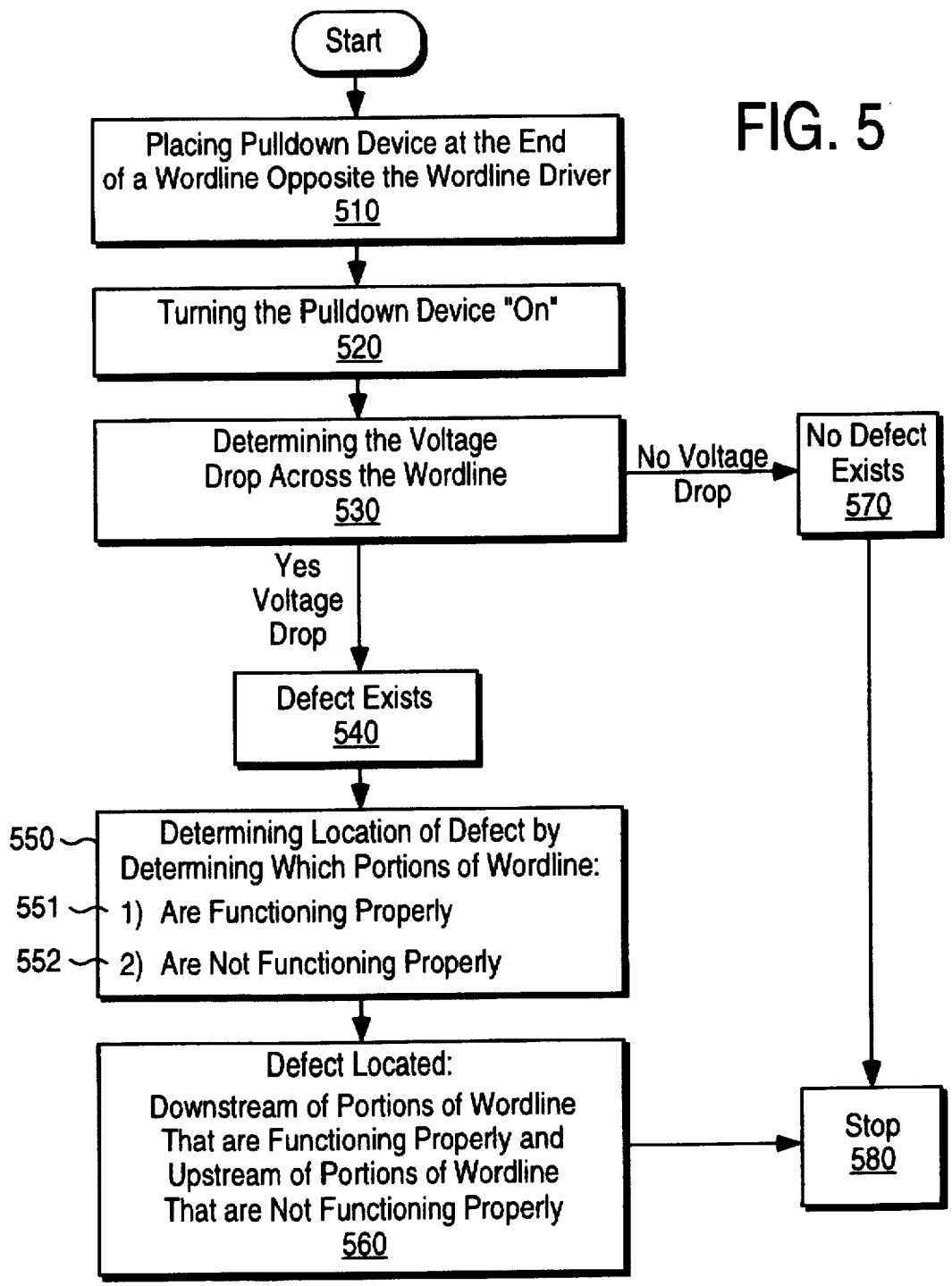

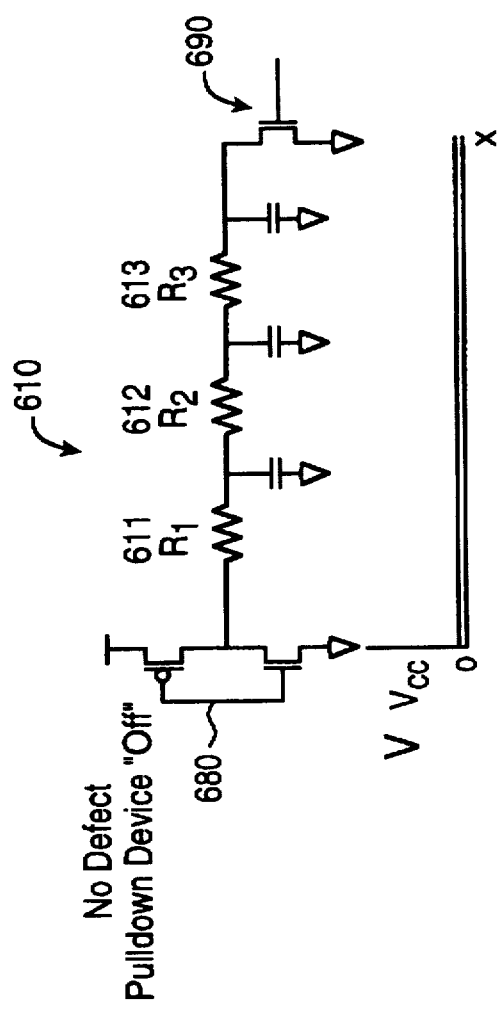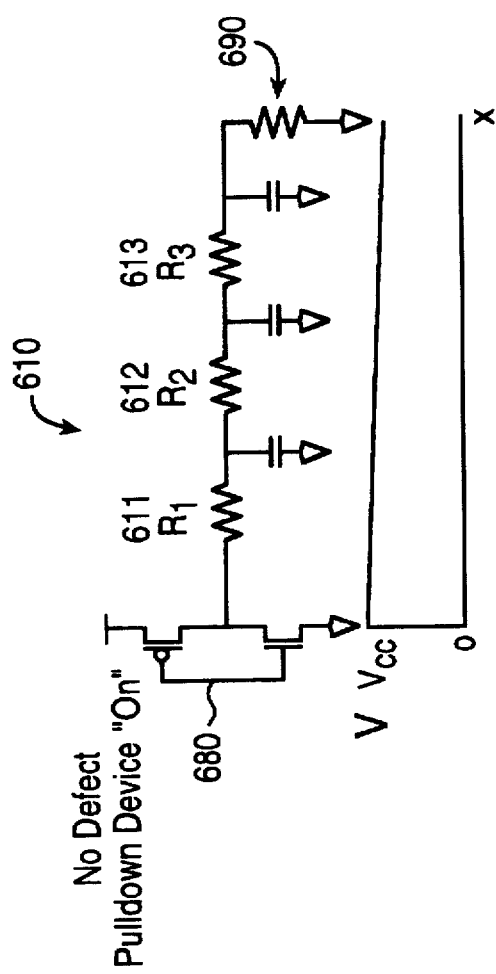

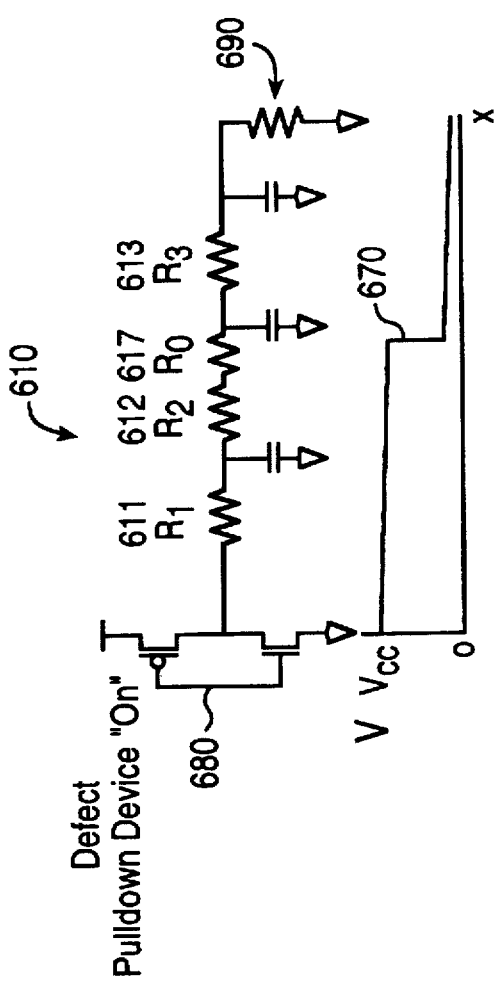

MEMORY TEST MODE FOR WORDLINE RESISTIVE DEFECTS

BACKGROUND OF THE INVENTION

1. Field of the Invention

This invention relates to the field of memory devices, and more specifically, to a method and apparatus for detecting and locating resistive defects in the wordlines of memories.

2. Background Information

In memory devices, for example SRAM, DRAM, etc. it is a common practice to run wordlines using polysilicon. However, because polysilicon intrinsically has a high resistance, on the order of approximately 50–500 ohms per square ($\Omega$/sq), many manufacturers combined the polysilicon with a cladding layer. Cladding layers 120 are generally formed above the polysilicon layer 110 and run parallel to the polysilicon layer, as is illustrated in FIG. 1a. Cladding layers 120 may be made of materials, such as, titanium silicide, tungsten, cobalt silicide, and other lower resistance materials. Because the cladding layer is generally made up of a lower resistance material, the combined polysilicon with cladding layer may have a resistance on the order of approximately 3–10 ohms per square ($\Omega$/sq). Thus, the combined polysilicon with cladding layer wordline 100 has a significantly lower resistance than that of just polysilicon wordlines.

A problem that occurs, however in the combined polysilicon with cladding layer designs is that cracks, breaks, or other defects may be formed in the polysilicon layer, in the cladding layer, or both. A defect increases the resistance in the wordline, slowing down the functioning of the memory, and thus impairs the frequency operation of the memory device. Since the resistance of the polysilicon layer is already high and because the cladding layer (which has a lower resistance) may be used to bypass the polysilicon layer, a defect 130 in the polysilicon layer (as illustrated in FIG. 1b) may slow down a memory array on the order of a few nanoseconds. A few nanoseconds in current memory technology is not a significant amount of time, however, in future generations of memory technology this could become a crucial amount of time. Currently however, one of the main concerns in memory technology is with defects that occur in the cladding layer.

Recall that the cladding layer is made of a lower resistance material and is used to offset the significantly higher resistance of the polysilicon layer. A defect 140 in the cladding layer increases the resistance of the cladding layer and may cause the use of the higher resistance polysilicon layer to bypass the defect in the cladding layer (as is illustrated in FIG. 1c). Thus, a defect in the cladding layer may cause a part to slow down fractions of nanoseconds for minor defects to several microseconds for severe defects. The extra resistance caused by the defect 140 in the cladding layer translates into delay which substantially slows down the part.

Another problem, which stems from the problem of defects slowing down a memory device, is the detection of such defects during testing. When testing a part for defects, defects which form an open in the wordline can be detected because they disable at least a portion of the memory device. Defects, such as those described above with respect to the cladding layer and polysilicon layer, do not completely disable a portion of the memory device. Rather, such defects only slow the device down. Current methods for testing memory devices are only able to detect defects which disable a portion of the memory device and are unable to detect defects which only slow the device down.

Testing memory devices requires the use of complex test patterns. Memories are made up of bits which are arranged in an array format using rows and columns. The bits in the memory array are densely packed in order to follow the trend toward the minimum design rule. A typical memory array may be made up of millions and billions of bits. Thus, in order to test these arrays for defects exhaustive memory test patterns have to be conducted. FIG. 2 illustrates a simplified example of a memory array 200. Memory array 200 is made up of wordlines 210 that correspond to rows 250. Wordlines 210 are made up of bits (not shown) that correspond to columns 260. Thus, to access a particular bit in memory array 200, the wordline 210 is selected by row and the bit in that wordline is selected by column.

One such prior art test, which is considered the most simplistic, is to read and write to every bit of the memory array. Reading and writing to every bit tests each bit for functionality. Such a test technique sounds easy enough, however, a simple memory array may have millions of bits. Testing in this simple manner only allows the detection of the simplest types of defects. Some defects are very difficult to detect and if they escape detection they may potentially cause failures later in the life of the device.

Another prior art test, commonly called the "butterfly", reads and writes to several bits of the memory array. The butterfly technique reads 330 to a single bit 311 in a memory array 300 (as illustrated in FIG. 3a), writes 340 to the bits (312, 313, 314, and 315) which surround bit 311 (as is illustrated in FIG. 3b), and then reads 330 the bit 311 again (as is illustrated in FIG. 3c). This process is repeated in several patterns over the memory array. For example, the butterfly technique may start in the upper left hand corner of the array 300 and work horizontally across the rows and then down the columns to the next row (as illustrated in FIG. 3d), then the technique may work vertically down the column and across the row to the next column (as illustrated in FIG. 3e), and then the technique may work diagonally across the memory array (as illustrated in FIG. 3f). By testing the array in different fashions (i.e. horizontally, vertically, and diagonally) each of these testing fashions may find some subset of problems within the memory array that enables the detection of a defect.

Other prior art tests using various testing patterns and functions are also available, but still exhibit similar problems to the two examples given above. Among these problems is the fact that these prior art tests are slow. Testing each bit individually or testing a complex pattern of bits in a memory device that is made up of millions of bits is extremely time consuming.

Another problem associated with the testing techniques described above is that they just test whether or not the device is working. These prior art techniques do not test whether or not the memory device is functioning at the appropriate frequency or speed. This is due in large part to the types of testers which are currently available. Presently available testers test memory devices at much slower speeds (or frequencies) than the devices actually run. Since these testers test memory devices at lower frequencies they are unable to determine if the memory device is capable of functioning at its appropriate frequency. Thus, the only defects detectable using current testing techniques are those defects which affect whether or not the memory device works. In other words, only those defects which disable a portion of the memory device may be detected. Therefore, in the example described above wherein the defect is in the cladding layer of the wordline and the device still works but at a lower frequency, the defect would not be detected using such prior art testing techniques.

Testers which have the ability to run such complex memory test patterns at high frequencies and have the ability to detect small performance variations between devices are expensive and hard to find. Even if such higher frequency testers were readily available they would be so outrageously expensive that their cost would be prohibitive of their use.

An additional problem with current memory array testing techniques at very high frequency is that these testing techniques are unable to determine the location of defect(s) within the memory array. It is important to determine the location of the defect in order to address how the defect occurred. For example, if the location of the defect is known, a manufacturer may look to the processing steps used to create that portion of the memory array. If it is determined that an error in the processing steps created the defect, then that error may be corrected in the future when manufacturing such memory arrays.

Thus, what is needed is a method and apparatus for detecting defects that not only has the ability to detect defects that disable a portion of the memory device, but also has the ability to detect defects that lower the frequency of the memory device. It would also be advantageous if such a method and apparatus had the capability of determining the location of such defects in the wordlines of memory arrays.

SUMMARY OF THE INVENTION

The present invention describes a method and apparatus for detecting defects in a memory device by placing a pulldown device at the end of a wordline opposite the end of the wordline having a wordline driver. The pulldown device has a selected on resistance, such that when the pulldown device is turned on, it may be determined if a defect exists in the wordline by testing all the bits on the wordline to determine if the voltage drop across a defect is great enough to prevent the selection of a bit along the wordline.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 2 illustrates a simplified example of a memory array.

FIG. 5 illustrates a flow chart of one embodiment of the present invention.

FIG. 6a illustrates an embodiment of the present invention wherein the wordline is not enabled.

FIG. 6b illustrates an embodiment of the present invention wherein the wordline does not contain a defect and is enabled.

FIG. 6b illustrates an embodiment of the present invention wherein the wordline contains a defect and is enabled.

FIG. 6x graphically illustrates voltage versus x-position on the wordline of FIG. 6a.

FIG. 6y graphically illustrates voltage versus x-position on the wordline of FIG. 6b.

FIG. 6z graphically illustrates voltage versus x-position on the wordline of FIG. 6c.

DETAILED DESCRIPTION

A Memory Test Mode for Wordline Resistive Defects is disclosed. In the following description, numerous specific details are set forth such as specific materials, devices, parameters, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for detecting defects, for example resistive defects, in memory arrays. As memory arrays become more complex and dense it is becoming harder to test the memory arrays for defects. In particular, it becomes hard to detect defects that do not completely disable a portion of the memory array, but instead just slow a portion of the memory array down. It is desired to detect such defects in order to reduce the number of defective parts shipped to the customer and to identify the areas of processing that may cause such defects in order to remedy the problem in future manufacturing.

The present invention is a functional test for detecting defects that may be operated at frequencies compatible with wafer level testing. In other words, the present invention may be run at lower frequencies. The present invention not only enables the detection of defects which disable a portion of a memory array, but also those defects that merely slow down the frequency of the memory array, for example, resistive defects. The present invention also has the capability of determining the location of a defect.

Figure 1A:
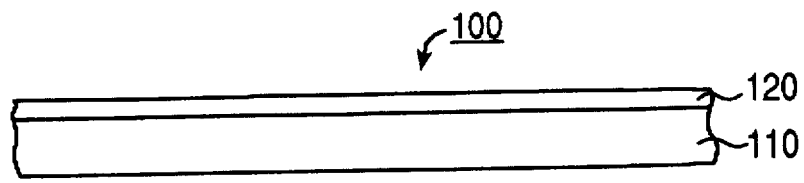
FIG. 1a illustrates a portion of a wordline without defects.
Figure 1B:
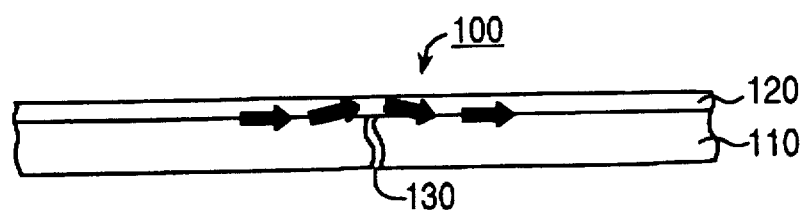
FIG. 1b illustrates a portion of a wordline having a defect in the high resistance layer.
Figure 1C:
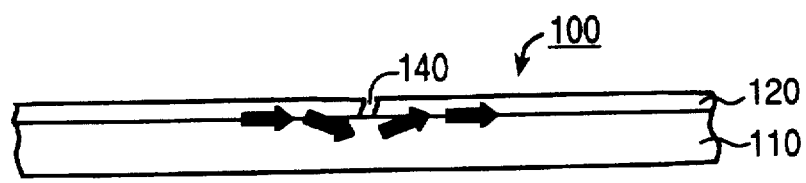
FIG. 1c illustrates a portion of a wordline having a defect in the low resistance layer.
Figure 3A:
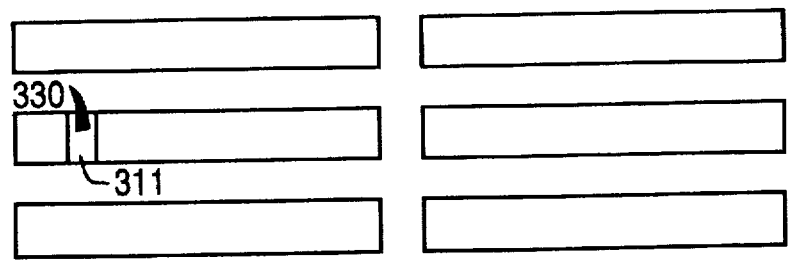
FIGS. 3a–3f illustrate a prior art method for testing memory arrays.
Figure 3B:
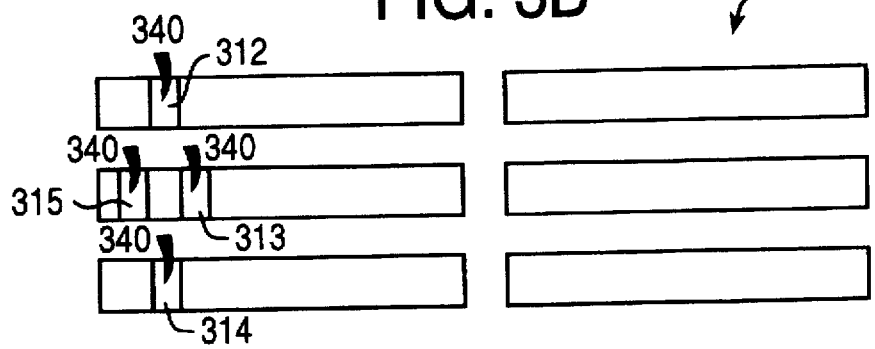
Figure 3C:
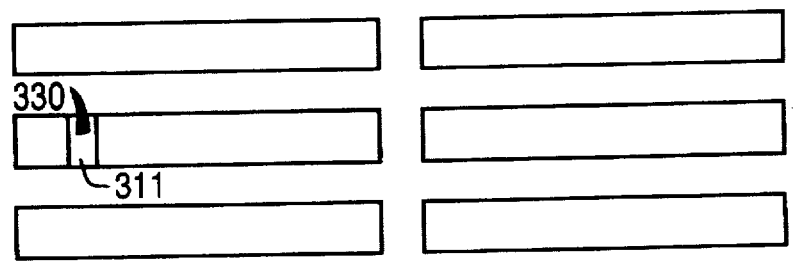
Figure 3D:
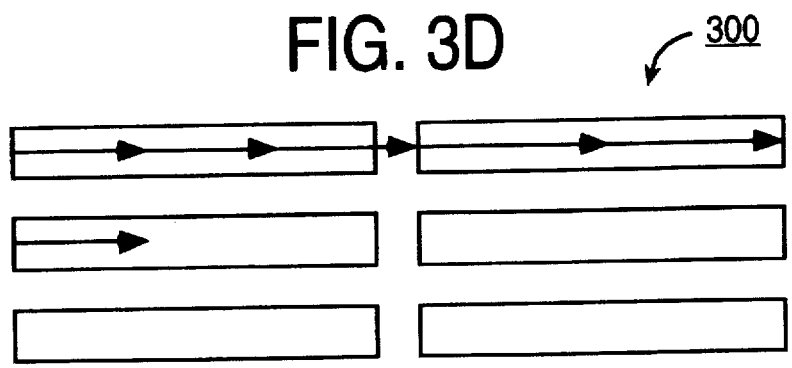
Figure 3E:
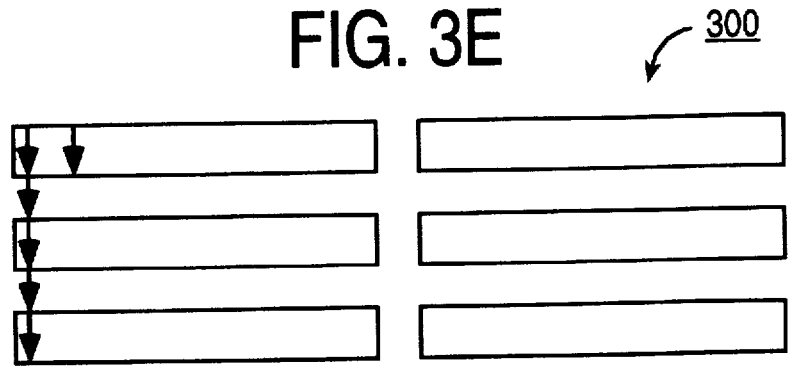
Figure 3F:
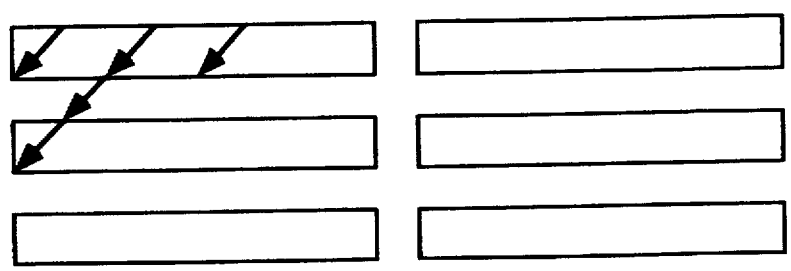
Figure 4:
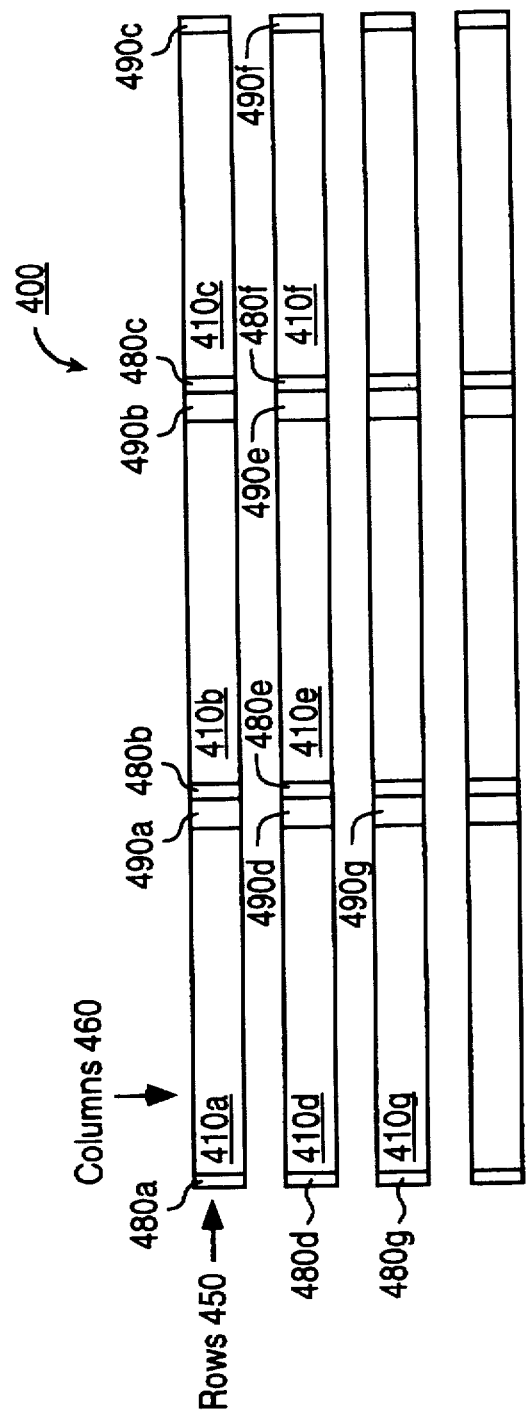
FIG. 4 illustrates one embodiment of the present invention.

One embodiment of the present invention is illustrated in FIG. 4. FIG. 4 illustrates a simplified memory array 400 of wordlines 410 organized in rows 450 and columns 460. At one end of each wordline 410 is a wordline driver (driver) 480. Driver 480 sets the wordline 410 high (i.e. turns the wordline "on") by applying a voltage, referred to herein as $V_{cc}$, to the wordline 410. At the other end of wordline 410, i.e. the end of wordline 410 opposite driver 480, is a pulldown device 490.

Pulldown device 490 is a device which may be turned on and off such that when pulldown device 490 is turned on it has a selected on resistance. When pulldown device is turned on a resistance divider is essentially created between the wordline driver resistance, the wordline wire resistance, and the pulldown device resistance. Wordline driver resistance, in general, is negligible in comparison to the wordline wire resistance and pulldown device resistance and may be neglected. Wordline wire resistance is the sum of the characteristic resistance of each of the devices that make up wordline 410. For example, referring to FIG. 6a, the wordline wire resistance of wordline 610 is the sum of the resistances of devices 611, 612, and 613 (i.e. the sum of device resistances $R_1$, $R_2$, and $R_3$). The pulldown device resistance is determined by the user and in general, is selected to be a few times larger than the intended wordline wire resistance. It should be noted that the intended or normal wordline wire resistance is the resistance of the wordline assuming no defects are present. It also should be noted that the pulldown device should be sized with a resistance sufficiently large compared to the intended wordline wire resistance so that the memory will still function when the pulldown device is turned on.

Pulldown device 490 in one embodiment of the present invention is a small MOS transistor. It should be noted and it will be obvious to one with ordinary skill in the art that, pulldown device 490 does not have to be a MOS transistor. Pulldown device 490 may be another type of transistor or another type of device depending upon what type of wordline or type of devices that make up the wordline are being tested. One embodiment of the present invention the wordline 410 is made of a combined polysilicon layer with a titanium silicide cladding layer and the pulldown device is an MOS transistor. For example, in one embodiment, an N-MOS pulldown device may be used with a wordline that is active high and in another embodiment, a P-MOS pulldown device may be used with a wordline that is active low.

FIG. 5 illustrates a flow chart of one embodiment of the present invention. In order to test the wordline 410 for defects, at step 510, the pulldown device 490 is placed at then end of the wordline 410 opposite driver 480. In particular, in one embodiment of the present invention wherein a transistor is used as the pulldown device, the drain of the transistor is coupled to the wordline, the source is coupled to $V_{ss}$, and the gate is coupled to the control signal. The control signal turns on and off the pulldown device by bringing the gate to $V_{cc}$ and low, respectively. At step 520, the pull down device 490 is turned on. It should be noted that in one embodiment of the present invention the pulldown device 490 is turned on at the same time that the driver 480 enables the wordline 410. After the pulldown device 490 is turned on the voltage drop across the wordline is determined, at step 530. The determination of the voltage drop across a wordline is explained in greater detail below with respect to FIGS. 6a, 6b, 6c, 6x, 6y, and 6z.

FIGS. 6a, 6b, and 6c illustrate an embodiment of the present invention by depicting the wordline driver, wordline, and pulldown device as a series of transistors and resistors. FIG. 6a illustrates a wordline 610 when the pulldown device 690 is "off" and the wordline driver 680 is not enabled, i.e. the voltage of the device is approximately zero. FIG. 6x graphically illustrates voltage versus the x-position along the wordline 610 of FIG. 6a. As shown in FIG. 6x, the voltage is approximately zero at every position along the wordline 610.

FIG. 6b illustrates wordline 610 when no defect is present, the wordline is brought to $V_{cc}$ by driver 680, and pulldown device 690 is turned "on". As shown in FIG. 6b, when pulldown device 690 is turned on it acts as an additional resistance at the end of wordline 610. For example, in one embodiment of the present invention, for a wordline that functions at approximately 1.6–2 kΩ, a pulldown device that provides approximately 8 kΩ of resistance may be used. FIG. 6y graphically illustrates voltage versus the x-position along the wordline 610 of FIG. 6b. As shown in FIG. 6y, when no defect exists in the wordline and the pulldown device is turned on, the voltage near driver 680 is approximately $V_{cc}$ and may fall off slightly from $V_{cc}$ as the voltage is measured along the wordline further and further from the driver. Because a defect is not present in wordline 610 of FIG. 6b, the pulldown device 690 does not affect the functioning of the wordline. Returning to the flow chart illustrated in FIG. 5, since only a negligible voltage drop is present, at step 530, it is determined that no defect exists, at step 570. Because a defect does not exist in the wordline the testing of the wordline is then stopped, at step 580.

FIG. 6c illustrates wordline 610 when a defect 670 is present. As before, wordline 610 is brought to $V_{cc}$ by driver 680 and pulldown device 690 is turned "on". However, when pulldown device 690 is turned on and a defect 670 exists in wordline 610, the pulldown device 690 will cause current to flow-through the defective wordlines increased resistance and will create a large/noticeable voltage drop across the wordline. If the increase in the wordline resistance due to the defect is very large, then the memory will no longer function with the pulldown device on, and the voltage along the wordline will drop to approximately zero or some nominal value. If the increase in the wordline resistance is in an intermediate range, then the memory may still function, but at a lower frequency and the wordline voltage will be reduced.

FIG. 6z graphically illustrates voltage versus the x-position along the wordline 610 of FIG. 6c, wherein a defect 670 exists in the wordline. As shown in FIG. 6z, when a defect exists in the wordline and the pulldown device is turned on, the voltage near driver 680 is approximately $V_{cc}$ and may fall off slightly from $V_{cc}$ as the voltage is measured along the wordline, but at the point in the wordline where defect 670 is located the voltage drops and remains low thereafter. It should be noted and it will be obvious to one with ordinary skill in the art that FIG. 6z represents the voltage drop in a wordline wherein wordline 610 is not completely disabled but rather is functioning at a lower frequency. In other words, the portion of the wordline 610 upstream of defect 670 is functioning properly and at normal frequency, but the portion of wordline 610 downstream of defect 670 is still functioning but at a lower frequency. Such an effect is demonstrative of a resistive defect, such as a break or crack in the cladding layer and/or the polysilicon layer of a wordline as described in the background of the invention.

The pulldown device enables defects which merely slow down the functioning of a memory array to be detected by causing a voltage drop in the wordline of the memory array at the point in which the defect occurs. The voltage drop caused by pulldown device is proportional to the decrease in the frequency of the device caused by the defect. Therefore, although the memory array is still functioning the performance of the array has decreased and may be determined by measuring the voltage drop. Thus, the present invention enables the detection of a defect by providing the ability to indirectly detect a voltage drop using functional pattern testing.

Returning to the flow chart illustrated in FIG. 5, since a voltage drop is present, at step 530, it is determined that a defect exists, at step 540. It should be noted and it will be obvious to one with ordinary skill in the art that in order to simply determine if a defect exists the voltage of the wordline 610 need only be measured at each end of the wordline in order to determine if a voltage drop exists. If a voltage drop exists, then there is a defect. However, the present invention not only enables the determination that a defect exists, but also has the capability of determining the location of the defect within the memory array, at step 550. The defect can be located by determining which portions of the wordline are functioning properly (substep 551) and which portions of the wordline are not functioning properly (substep 552). This may be accomplished by measuring the voltage at other positions along the wordline rather than at just the ends of the wordline.

As illustrated in FIGS. 6c and 6z, the voltage drop occurs along the x-position of the wordline proximately located to defect 670 in wordline 610. By measuring the voltage at various points along the wordline while the pulldown device is turned on, the area in which the voltage drop occurs can be determined. If the voltage at the point being measured is approximately $V_{cc}$, then that portion of the wordline is functioning properly. If the voltage measured is less than $V_{cc}$, then that portion of the wordline, and any portion of the wordline downstream therefrom, are not functioning properly. As stated earlier, the point or area in which the voltage drop occurs corresponds to the position at which the defect exists in the wordline. Thus, the defect is located downstream of the portions of the wordline that are functioning properly and upstream of the portions of the wordline that are not functioning properly.

It should be noted that although the above description discusses the present invention with regard to a single wordline, it will be obvious to one with ordinary skill in the art that the present invention may be applied in similar manner to an entire memory array made up of multiple wordlines. In other words, rather than testing a memory array for defects wordline by wordline, the present invention may be used to test an entire memory array made up of multiple wordlines for defects as a whole in a similar manner as that in which a single wordline is tested. For example, in a wordline array, each wordline has its own driver and similarly, each wordline has its own pulldown device placed on the opposite end of the wordline than the driver. In one embodiment of the present invention where a memory array with multiple wordlines is tested, a single control signal is used that turns on all of the pulldown devices in the memory array in parallel.

Additionally, a defect in the memory array may be located by determining which portions of the entire memory array are functioning properly and which portions of the entire memory array are not. The defect being located in the memory array downstream of the portions that are functioning properly and upstream of the portions that are not functioning properly. For example, in FIG. 4, if a defect exists in the first column of the second row of memory array 400, all of the wordlines 410 up to that point in memory array 400 will function correctly (i.e. wordlines 410a, 410b, and 410c will function correctly). All of the bits on wordline 410d (i.e. the bits in the first column of the second row of memory array 400) up to the defect will function correctly and all of the bits after the defect on wordline 410d will not function correctly. All wordlines 410 past this point in the memory array 400 will also function correctly (i.e. wordlines 410e, 410f, 410g, etc. will function correctly). Thus, a defect may be determined to exist in memory array 400 and may be located by determining which point of which wordline 410 in the memory array 400 that a voltage drop caused by such defect produced a functional failure.

It should be noted in arrays with multiple wordlines and multiple pulldown devices the pulldown devices should be able to be turned on and off at the same time. It should also be noted that the pulldown device must be able to be turned completely off, with acceptably low leakage, when not in use.

Thus, A Memory Test Mode for Wordline Resistive Defects has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for detecting defects in a memory comprising:

placing a pulldown device at an end of a wordline, wherein said pulldown device is located at said end of said wordline opposite a wordline driver, said pulldown device having a selected on resistance;

turning said pulldown device on; and determining the voltage drop on said wordline.

2. The method as described in claim 1 wherein said step of determining the voltage drop on wordline further comprises:

testing said wordline for a voltage drop; and determining if a defect exists in said wordline based upon the following criteria:

if no voltage drop is observed, then a defect does not exist;

if a nominal voltage drop is observed, then a defect does not exist;

if an intermediate voltage drop is observed and said memory functions at a lower frequency, then a defect does exist; and if a large voltage drop is observed and said memory does not function, then a defect does exist.

3. The method as described in claim 1 further comprising the step of determining the location of said defect in said memory.

4. The method as described in claim 3 wherein said step of determining the location of said defect in said memory comprises:

ascertaining which portions of said memory are functioning properly; and ascertaining which portions of said memory are not functioning properly;

said defect being located within a region downstream of the portions of said memory which are functioning properly and upstream of the portions of said memory which are not functioning properly.

5. A method for detecting defects in a memory comprising:

providing a plurality of wordlines having a first end and a second end;

providing a plurality of drivers coupled to said first end of each of said plurality of wordlines;

placing a plurality of pulldown devices at said second end of each of said plurality of wordlines opposite said first end of each of said plurality of wordlines having said drivers coupled thereto;

turning on said plurality of pulldown devices; and determining the voltage drop on said plurality of wordlines.

6. The method as described in claim 5 wherein said plurality of pulldown devices have a selected on resistance and said plurality of pulldown devices are turned on at the same time.

7. The method as described in claim 5 wherein said step of determining the voltage drop on said plurality of wordlines further comprises:

testing each of said plurality of wordlines for a voltage drop; and determining if a defect exists in each of said plurality of wordlines based upon the following criteria:

if no voltage drop is observed, then a defect does not exist;

if a nominal voltage drop is observed, then a defect does not exist;

if an intermediate voltage drop is observed and said memory functions at a lower frequency, then a defect does exist; and if a large voltage drop is observed and said memory does not function, then a defect does exist.

8. The method as described in claim 5 further comprising the step of determining the location of said defect in said memory.

9. The method as described in claim 8 wherein said memory is divided into a plurality of rows of wordlines and said step of determining the location of said defect in said memory comprises:

ascertaining which of said plurality of wordlines are functioning properly; and ascertaining which of said plurality of wordlines are not functioning properly;

determining in which row of memory each of said plurality of wordlines that are not functioning properly is located;

said defect being located in said first row of said memory that contains a wordline which is not functioning properly.

10. The method as described in claim 9 wherein said rows of said wordlines in said memory are further divided into a plurality of columns and said step of determining the location of said defect in said memory further comprises the steps of:

ascertaining which portions of said wordline as defined by said plurality of columns are functioning properly; and ascertaining which portions of said wordline as defined by said plurality of columns are not functioning properly;

said defect being located in said first row of said memory that contains a wordline which is not functioning properly and said defect being located in said column located within a region downstream of the portions of said wordline as defined by said plurality of columns which are functioning properly and upstream of the portions of said wordline as defined by said plurality of columns which are not functioning properly.

11. An apparatus for detecting defects in a memory comprising:

a memory a plurality of wordlines in said memory, said wordlines having a first end and a second end;

a plurality of drivers, said drivers coupled to said first end of each of said plurality of wordlines;

a plurality of pulldown devices, said pulldown devices coupled to said second end of each of said plurality of wordlines opposite said first end of said wordlines coupled to said driver; and a switch for turning said plurality of pulldown devices on and off.

12. The apparatus as described in claim 11 wherein said memory is configured in an array of rows and columns, wherein said rows are made up of wordlines and said columns divide said wordlines into device portions.

13. The apparatus as described in claim 11 wherein said pulldown device is a small MOS device that has a selected on resistance.

14. The apparatus as described in claim 11 wherein said switch turns said plurality of pulldown devices on and off at the same time.

15. An apparatus for detecting defects in a memory comprising:

a memory a plurality of wordlines in said memory, said wordlines having a first end and a second end;

a plurality of drivers, said drivers coupled to said first end of each of said plurality of wordlines;

a plurality of pulldown devices, said pulldown devices coupled to said second end of each of said plurality of wordlines opposite said first end of said wordlines coupled to said driver; and a means for turning said plurality of pulldown devices on and off.

16. The apparatus as described in claim 15 wherein said memory is configured in an array of rows and columns, wherein said rows are made up of wordlines and said columns divide said wordlines into device portions.

17. The apparatus as described in claim 15 wherein said means for turning said plurality of pulldown devices on and off turns said plurality of pulldown devices on and off at the same time.

18. The apparatus as described in claim 15 wherein said means for turning said plurality of pulldown devices on and off comprises a switch.

* * * * *